United States Patent
Blaydes et al.

(10) Patent No.: US 10,062,800 B2
(45) Date of Patent: Aug. 28, 2018

(54) PHOTOVOLTAIC DEVICES AND METHOD OF MAKING

(71) Applicant: First Solar, Inc., Tempe, AZ (US)

(72) Inventors: Holly Ann Blaydes, Burnt Hills, NY (US); Kristian William Andreini, Burnt Hills, NY (US); William Hullinger Huber, Niskayuna, NY (US); Eugene Thomas Hinners, Gansevoort, NY (US); Joseph John Shiang, Niskayuna, NY (US); Yong Liang, Niskayuna, NY (US); Jongwoo Choi, Niskayuna, NY (US); Adam Fraser Halverson, Albany, NY (US)

(73) Assignee: First Solar, Inc., Tempe, AZ (US)

( * ) Notice: Subject to any disclaimer, the term of this patent is extended or adjusted under 35 U.S.C. 154(b) by 568 days.

(21) Appl. No.: 13/912,782

(22) Filed: Jun. 7, 2013

(65) Prior Publication Data
US 2014/0360565 A1    Dec. 11, 2014

(51) Int. Cl.
| H01L 31/0272 | (2006.01) |
| H01L 31/18 | (2006.01) |
| H01L 31/0224 | (2006.01) |
| H01L 31/0296 | (2006.01) |
| H01L 31/065 | (2012.01) |
| H01L 31/073 | (2012.01) |

(52) U.S. Cl.
CPC .... *H01L 31/1828* (2013.01); *H01L 31/02966* (2013.01); *H01L 31/022425* (2013.01); *H01L 31/065* (2013.01); *H01L 31/073* (2013.01); *H01L 31/1832* (2013.01); *Y02E 10/543* (2013.01); *Y02P 70/521* (2015.11)

(58) Field of Classification Search
CPC ......... H01L 31/1828; H01L 31/022425; H01L 31/02966; H01L 31/065; H01L 31/073; H01L 31/1832
See application file for complete search history.

(56) References Cited

U.S. PATENT DOCUMENTS

| 3,496,024 A | 2/1970 | Raruehrwein |
| 3,565,686 A | 2/1971 | Babcock et al. |

(Continued)

FOREIGN PATENT DOCUMENTS

| AU | 2012200546 A1 | 8/2012 |
| CN | 102244110 B | 11/2011 |

(Continued)

OTHER PUBLICATIONS

MacDonald et al., "Layer-by-Layer Assembly of Sintered CdSexTe1—x Nanocrystal Solar Cells", ACS Nano, 2012, 6 (7), pp. 5995-6004 (Published online on Jun. 12, 2012, and accessed from http://pubs.acs.org/doi/abs/10.1021/nn3009189).*

(Continued)

*Primary Examiner* — Golam Mowla

(74) *Attorney, Agent, or Firm* — MacMillan, Sobanski & Todd, LLC

(57) ABSTRACT

A photovoltaic device is presented. The photovoltaic device includes a layer stack; and an absorber layer is disposed on the layer stack. The absorber layer includes selenium, and an atomic concentration of selenium varies non-linearly across a thickness of the absorber layer. A method of making a photovoltaic device is also presented.

21 Claims, 11 Drawing Sheets

(56) References Cited

U.S. PATENT DOCUMENTS

| | | | |
|---|---|---|---|
| 4,368,216 A | 1/1983 | Manassen et al. | |
| 4,382,118 A | 5/1983 | Oka | |
| 4,388,483 A | 6/1983 | Basol et al. | |
| 4,568,792 A | 2/1986 | Mooney et al. | |
| 4,614,891 A | 9/1986 | Kuwahata et al. | |
| 4,682,212 A | 7/1987 | Inuiya et al. | |
| 5,578,502 A | 11/1996 | Albright et al. | |
| 5,909,632 A | 6/1999 | Gessert | |
| 6,379,767 B1 | 4/2002 | Park et al. | |
| 6,488,770 B1 | 12/2002 | Meissner et al. | |
| 6,537,845 B1 | 3/2003 | McCandless et al. | |
| 7,812,249 B2 | 10/2010 | King et al. | |
| 7,985,919 B1 | 7/2011 | Roscheisen et al. | |
| 8,084,682 B2 | 12/2011 | Chen | |
| 8,198,117 B2 | 6/2012 | Leidholm et al. | |
| 8,309,387 B2 | 11/2012 | Forehand | |
| 8,426,722 B2 | 4/2013 | Munteanu et al. | |
| 8,653,616 B2 | 8/2014 | Kamada et al. | |
| 9,276,154 B2 | 3/2016 | Damjanovic et al. | |
| 2003/0070707 A1 | 4/2003 | King et al. | |
| 2004/0063320 A1 | 4/2004 | Hollars | |
| 2004/0261841 A1 | 12/2004 | Negami et al. | |
| 2005/0041571 A1 | 2/2005 | Ichihara et al. | |
| 2006/0213550 A1 | 9/2006 | Yamazaki et al. | |
| 2007/0000537 A1 | 1/2007 | Leidholm et al. | |
| 2007/0295390 A1 | 12/2007 | Sheats et al. | |
| 2008/0092945 A1 | 4/2008 | Munteanu et al. | |
| 2008/0110498 A1 | 5/2008 | Zafar et al. | |
| 2008/0152868 A1 | 6/2008 | Sato et al. | |
| 2008/0156365 A1 | 7/2008 | Scholz et al. | |
| 2008/0223430 A1 | 9/2008 | Krasnov et al. | |
| 2008/0251119 A1 | 10/2008 | Forehand | |
| 2009/0020149 A1 | 1/2009 | Woods et al. | |
| 2009/0025640 A1 | 1/2009 | Sager et al. | |
| 2009/0235986 A1 | 9/2009 | Hotz et al. | |
| 2009/0242029 A1 | 10/2009 | Paulson et al. | |
| 2009/0261438 A1 | 10/2009 | Choi et al. | |
| 2010/0180935 A1 | 7/2010 | Chen | |
| 2010/0186815 A1 | 7/2010 | Yang et al. | |
| 2010/0186816 A1 | 7/2010 | Park et al. | |
| 2010/0206381 A1* | 8/2010 | Aida | H01L 31/0749 136/261 |
| 2010/0236607 A1 | 9/2010 | Korevaar et al. | |
| 2010/0326489 A1 | 12/2010 | Ahn | |
| 2011/0011983 A1 | 1/2011 | King et al. | |
| 2011/0024876 A1 | 2/2011 | Bower et al. | |
| 2011/0081743 A1 | 4/2011 | Kawano | |
| 2011/0139227 A1 | 6/2011 | Sivananthan et al. | |
| 2011/0139240 A1 | 6/2011 | Allenic et al. | |
| 2011/0220191 A1 | 9/2011 | Flood | |
| 2011/0247687 A1 | 10/2011 | Zhang et al. | |
| 2011/0265865 A1 | 11/2011 | Korevaar | |
| 2011/0272744 A1 | 11/2011 | Ning et al. | |
| 2011/0277838 A1 | 11/2011 | Ma et al. | |
| 2011/0290308 A1 | 12/2011 | Korevaar | |
| 2011/0318941 A1 | 12/2011 | Schmidt et al. | |
| 2012/0017977 A1 | 1/2012 | Satou et al. | |
| 2012/0067392 A1 | 3/2012 | Gloeckler | |
| 2012/0090661 A1 | 4/2012 | Capps et al. | |
| 2012/0132256 A1 | 5/2012 | Sager | |
| 2012/0132268 A1 | 5/2012 | Rojo et al. | |
| 2012/0138129 A1 | 6/2012 | Kim et al. | |
| 2012/0156828 A1 | 6/2012 | Peng et al. | |
| 2012/0180844 A1 | 7/2012 | Ward, III | |
| 2012/0192923 A1 | 8/2012 | Korevaar et al. | |
| 2012/0192930 A1 | 8/2012 | Fox et al. | |
| 2012/0313200 A1 | 12/2012 | Jackrel et al. | |
| 2013/0000726 A1 | 1/2013 | Skarp | |
| 2013/0037100 A1 | 2/2013 | Platzer Bjorkman et al. | |
| 2013/0068279 A1 | 3/2013 | Buller et al. | |
| 2013/0074912 A1 | 3/2013 | Walukiewicz et al. | |
| 2013/0081670 A1 | 4/2013 | Ashley et al. | |
| 2013/0104985 A1 | 5/2013 | Korevaar et al. | |
| 2013/0109124 A1 | 5/2013 | Peng et al. | |
| 2013/0280854 A1 | 10/2013 | Jasieniak et al. | |
| 2014/0216542 A1 | 8/2014 | Shao et al. | |
| 2014/0216550 A1 | 8/2014 | Damjanovic et al. | |
| 2014/0273334 A1 | 9/2014 | Christensen et al. | |
| 2014/0373908 A1 | 12/2014 | Duggal et al. | |
| 2015/0214403 A1 | 7/2015 | Wu et al. | |
| 2016/0126396 A1 | 5/2016 | Damjanovic et al. | |

FOREIGN PATENT DOCUMENTS

| | | |
|---|---|---|
| CN | 102365707 A | 2/2012 |
| CN | 102365752 A | 2/2012 |
| CN | 102244110 B | 9/2012 |
| EP | 0248953 A1 | 12/1987 |
| EP | 0300799 A2 | 1/1989 |
| EP | 2381482 A1 | 10/2011 |
| EP | 2954562 A2 | 8/2014 |
| WO | 2008136872 A2 | 11/2008 |
| WO | 2010031010 A1 | 3/2010 |
| WO | 2010110467 A1 | 9/2010 |
| WO | 2011036458 A2 | 3/2011 |
| WO | 2012002381 A1 | 1/2012 |
| WO | 2012045113 A1 | 4/2012 |
| WO | 2014151610 A1 | 9/2014 |
| WO | 2014179652 A1 | 11/2014 |

OTHER PUBLICATIONS

PCT International Search Report and Written Opinion, Application No. PCT/US14/36501, dated Sep. 5, 2014.

Tanaka et al., "Zinc and Selenium Co-Doped CdTe Substrates Lattice Matched to HgCdTe", Journal of Crystal Growth, vol. 94, Issue 1, Jan. 1989, pp. 166-170.

Burgelman et al., "Modelling polycrystalline semiconductor solar cells", Elsevier Science S.A., Thin Solid Films, 361-362 (2000), pp. 527-532.

Gloeckler et al., "Numerical Modeling of CIGS and CdTe Solar Cells:Setting the Baseline", 3rd World Conference on Photovolraic Enerby Conversion, May 11-18, 2003 Osokn. Japan, pp. 491-494.

PCT International Search Report and Written Opinion, Application No. PCT/US14/36503, dated Sep. 5, 2014.

Tanaka et al., "Zinc and Selenium Co-Doped CdTe Substrates Lattice Matched to HgCdTe," Journal of Crystal Growth, 1989, vol. 94, pp. 166-170.

European Extended Search Report, Application No. EP 14807775.3, dated Jan. 5, 2017.

Chinese First Office Action, Application No. 201480045027.0, dated Nov. 4, 2016.

European Extended Search Report, Application No. 14791065.7, dated Nov. 17, 2016.

Chanda, "Copper doped window layer for CdSe colar cells", Graduate School Theses and Dissertations, University of South Florida, 2008, pp. 1-74.

Duenow et al., "CdS/CdTe Solar Cells Containing Directly Deposited CdSxTe1-x Alloy Layers", Presented that the 37th IEEE Photovoltaic Specialists Conference, Seattle, Washington, Jun. 19-24, 2011, pp. 1-8.

Gur et al., "Air-Stable All-Inorganic Nanocrystal Solar Cells Processed from Solution", Science, 2005, vol. 310, pp. 462-465.

McCandless et al., "Cadmium Telluride Solar Cells", Handbook of Photovoltaic Science and Engineering, 2003, pp. 617-662.

Murali et al., "Electrical Properties of Sintered CdSxSe1-x Films", Chalcogenide Letters, 2008, vol. 5, No. 9, pp. 181-186.

Noori, "Optical Characteristics of CdSSe Films Prepared by Thermal Evaporation Technique", Baghdad Science Journal, 2011, vol. 8, No. 1, pp. 155-160.

Oladeji et al., "Metal/CdTe/CdS/Cd1-xZnxS/TCO/glass: A new CdTe thin film solar cell structure", Solar Energy Materials & Solar Cells, 2000, vol. 61, pp. 203-211.

Toyama et al., "Doping effects of dimethyl-tin-dichloride on material properties of CdS films and on formation of CdS/CdTe heterostructures", Journal off Applied Physics, 2005, vol. 98, pp. 1-6.

PCT International Search Report and the Written Opinion, Application No. PCT/US2014/014414, dated Jul. 30, 2014.

(56) References Cited

OTHER PUBLICATIONS

PCT International Search Report and the Written Opinion, Application No. PCT/US/2015/015387, dated Jun. 23, 2015.
Chilean Office Action, Application No. CL201503219, dated Oct. 16, 2017.
European Examination Report, Application No. 14791065.7, dated Jan. 22, 2018.
Chilean Second Office Action, Application No. CL 03219-2015, dated Mar. 14, 2018.
Chinese 1st Office Action, Appln. No. CN 201480037816.X, dated Aug. 4, 2017.
Chinese 2nd Office Action, Application No. CN 201480037816.X, dated Jan. 17, 2018.

* cited by examiner

PHOTOVOLTAIC DEVICES AND METHOD OF MAKING

BACKGROUND

The invention generally relates to photovoltaic devices. More particularly, the invention relates to photovoltaic devices including selenium, and methods of making the photovoltaic devices.

Thin film solar cells or photovoltaic (PV) devices typically include a plurality of semiconductor layers disposed on a transparent substrate, wherein one layer serves as a window layer and a second layer serves as an absorber layer. The window layer allows the penetration of solar radiation to the absorber layer, where the optical energy is converted to usable electrical energy. The window layer further functions to form a heterojunction (p-n junction) in combination with an absorber layer. Cadmium telluride/cadmium sulfide (CdTe/CdS) heterojunction-based photovoltaic cells are one such example of thin film solar cells, where CdS functions as the window layer.

However, thin film solar cells may have low conversion efficiencies. Thus, one of the main focuses in the field of photovoltaic devices is the improvement of conversion efficiency. Absorption of light by the window layer may be one of the phenomena limiting the conversion efficiency of a PV device. Further, a lattice mismatch between the window layer and absorber layer (e.g., CdS/CdTe) layer may lead to high defect density at the interface, which may further lead to shorter interface carrier lifetime. Thus, it is desirable to keep the window layer as thin as possible to help reduce optical losses by absorption. However, for most of the thin-film PV devices, if the window layer is too thin, a loss in performance can be observed due to low open circuit voltage ($V_{OC}$) and fill factor (FF).

Thus, there is a need for improved thin film photovoltaic devices configurations, and methods of manufacturing these.

BRIEF DESCRIPTION OF THE INVENTION

Embodiments of the present invention are included to meet these and other needs. One embodiment is a photovoltaic device. The photovoltaic device includes a layer stack; and an absorber layer is disposed on the layer stack. The absorber layer includes selenium, and an atomic concentration of selenium varies non-linearly across a thickness of the absorber layer.

One embodiment is a photovoltaic device. The photovoltaic device includes a layer stack including a transparent conductive oxide layer disposed on a support, a buffer layer disposed on the transparent conductive oxide layer, and a window layer disposed on the buffer layer. The layer stack further includes an absorber layer disposed on the layer stack, wherein the absorber layer includes selenium, and an atomic concentration of selenium varies non-linearly across a thickness of the absorber layer.

One embodiment is a method of making a photovoltaic device. The method includes providing an absorber layer on a layer stack, wherein the absorber layer includes selenium, and wherein an atomic concentration of selenium varies non-linearly across a thickness of the absorber layer.

DRAWINGS

These and other features, aspects, and advantages of the present invention will become better understood when the following detailed description is read with reference to the accompanying drawings, wherein.

DETAILED DESCRIPTION

Figure 1:
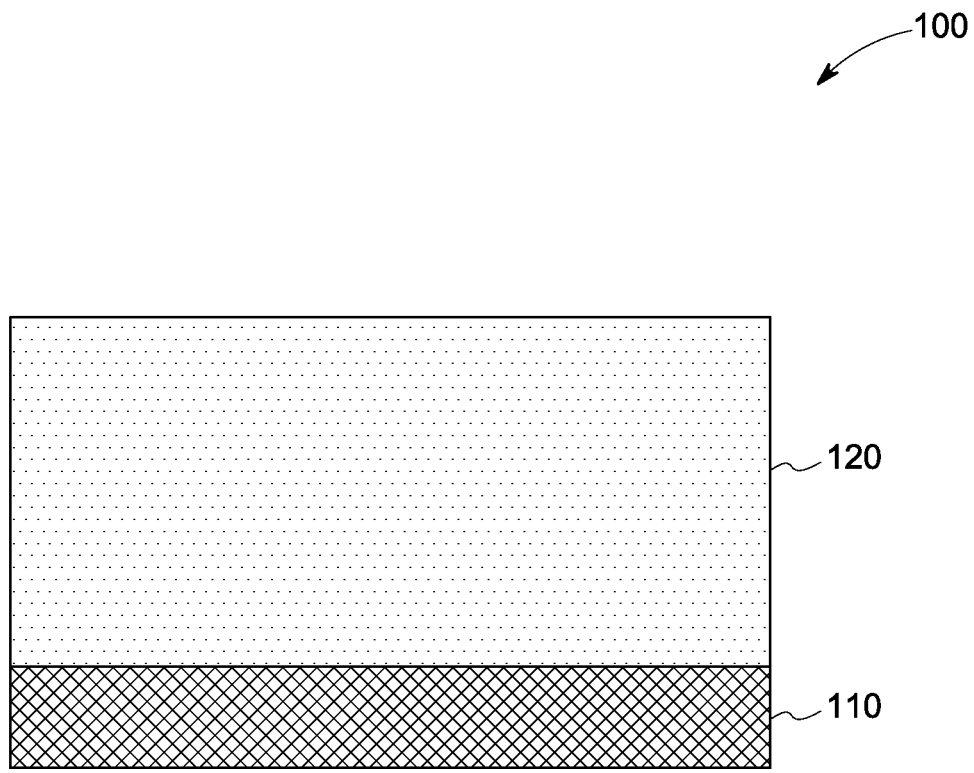
FIG. 1 is a schematic of a photovoltaic device, according to some embodiments of the invention.

As discussed in detail below, some of the embodiments of the invention include photovoltaic devices including selenium.

Approximating language, as used herein throughout the specification and claims, may be applied to modify any quantitative representation that could permissibly vary without resulting in a change in the basic function to which it is related. Accordingly, a value modified by a term or terms, such as "about", and "substantially" is not to be limited to the precise value specified. In some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

In the following specification and the claims, the singular forms "a", "an" and "the" include plural referents unless the context clearly dictates otherwise. As used herein, the term "or" is not meant to be exclusive and refers to at least one of the referenced components (for example, a layer) being present and includes instances in which a combination of the referenced components may be present, unless the context clearly dictates otherwise.

The terms "transparent region" and "transparent layer" as used herein, refer to a region or a layer that allows an average transmission of at least 70% of incident electromagnetic radiation having a wavelength in a range from about 350 nm to about 1000 nm.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. Furthermore, the term "a layer" as used herein refers to a single layer or a plurality of sub-layers, unless the context clearly dictates otherwise.

As used herein, the term "disposed on" refers to layers disposed directly in contact with each other or indirectly by having intervening layers therebetween, unless otherwise specifically indicated. The term "adjacent" as used herein means that the two layers are disposed contiguously and are in direct contact with each other.

In the present disclosure, when a layer is being described as "on" another layer or substrate, it is to be understood that the layers can either be directly contacting each other or have one (or more) layer or feature between the layers. Further, the term "on" describes the relative position of the layers to each other and does not necessarily mean "on top of" since the relative position above or below depends upon the orientation of the device to the viewer. Moreover, the use of "top," "bottom," "above," "below," and variations of these terms is made for convenience, and does not require any particular orientation of the components unless otherwise stated.

As discussed in detail below, some embodiments of the invention are directed to a photovoltaic device including selenium. A photovoltaic device 100, according to some embodiments of the invention, is illustrated in FIGS. 1-5. As shown in FIGS. 1-5, the photovoltaic device 100 includes a layer stack 110 and an absorber layer 120 disposed on the layer stack 110. The absorber layer 120 includes selenium, and an atomic concentration of selenium varies non-linearly across a thickness of the absorber layer 120.

The term "atomic concentration" as used in this context herein refers to the average number of selenium atoms per unit volume of the absorber layer. The terms "atomic concentration" and "concentration" are used herein interchangeably throughout the text. The term "varies non-linearly across the thickness" as used herein means that the rate-of-change in concentration itself varies across the thickness of the absorber layer 120.

As used herein the term "linear gradient" refers to the first derivative of a given property, which when measured respect to a dimensional parameter, such as the distance from the front contact is both continuous and constant. For example, a step-wise distribution with a fixed concentration of selenium (Se) at the front contact, which then abruptly transitions to a different concentration after some distance away from the front contact, is non-linear due to the fact that the first derivative is non-continuous at the point where the concentration of Se transitions from one value to another. An exponentially varying distribution is another example of a non-linear distribution since the value of the first derivative continuously changes as a function of distance. The linearity of a given distribution may be readily assessed by plotting the logarithm of the measured property versus the logarithm of the dimensional parameter. A linear gradient implies that the data when plotted this manner can be fit to a line with a unity slope. A super-linear distribution will have a slope greater than unity and a sub-linear distribution will have a slope less than 1.

Measurement of a first derivative of a material property in a real material implies averaging of the material property over a defined dimension and length scale, since the atomic nature of real materials may lead to local discontinuities of the first derivative. The non-linear distributions of interest according to some embodiments of the invention are in the axis that goes from the front contact to the back contact, which will be referred to as the z-axis or z-dimension. Thus, to measure the non-linearity of the distribution of a property along the z-axis, it may be useful to average the measured properties over the orthogonal axes, x, y in order to minimize the effect of grain-boundaries and other local inhomogeneities on the measurement.

A lower limit for the averaging window is set by the polaron radius of the material which scales the typical "size" of a charge carrier within a real material:

$$r_p = \sqrt{\frac{h}{4\pi m \omega}}$$

where h is Planck's constant, m is the effective mass of the charge carrier, and ω is the highest angular frequency of a typical vibration of the lattice, which is typically an optical phonon. In cadmium telluride (CdTe), the effective mass of the electron is about 0.1 $m_e$, where $m_e$ is the mass of an electron in free space and the phonon angular frequency is about $2.1 \times 10^{13}$. Thus, the calculated polaron radius is about 5 nm and a calculated polaron diameter is about 10 nm. Since proto-typical Gaussian or exponential wave functions have significant amplitude about 2-3 times their nominal characteristic size, then an estimate of the 'size' of charge carrier in CdTe based material is about 30 nm. A typical charge carrier in a CdTe type material will sample a 30 nm diameter sphere at any given time, and its behavior will to a large extent be determined by the average physical properties within this sphere. Thus, to determine the degree of non-linearity relevant to the performance of the photovoltaic cells in accordance with some embodiments of the invention, it may not be necessary to resolve non-linearities in the distribution of a given property or composition below a length scale of about 30 nm. An upper limit on the averaging required is set by the need to sample a sufficient number of points, i.e. 3, along the z axis so that the linearity of the distribution may be determined.

In some embodiments, there is a step-change in the concentration of selenium across the thickness of the absorber layer. In such instances, the selenium concentration may remain substantially constant for some portion of the thickness. The term "substantially constant" as used in this context means that the change in concentration is less than 5 percent across that portion of the thickness.

Figure 11:
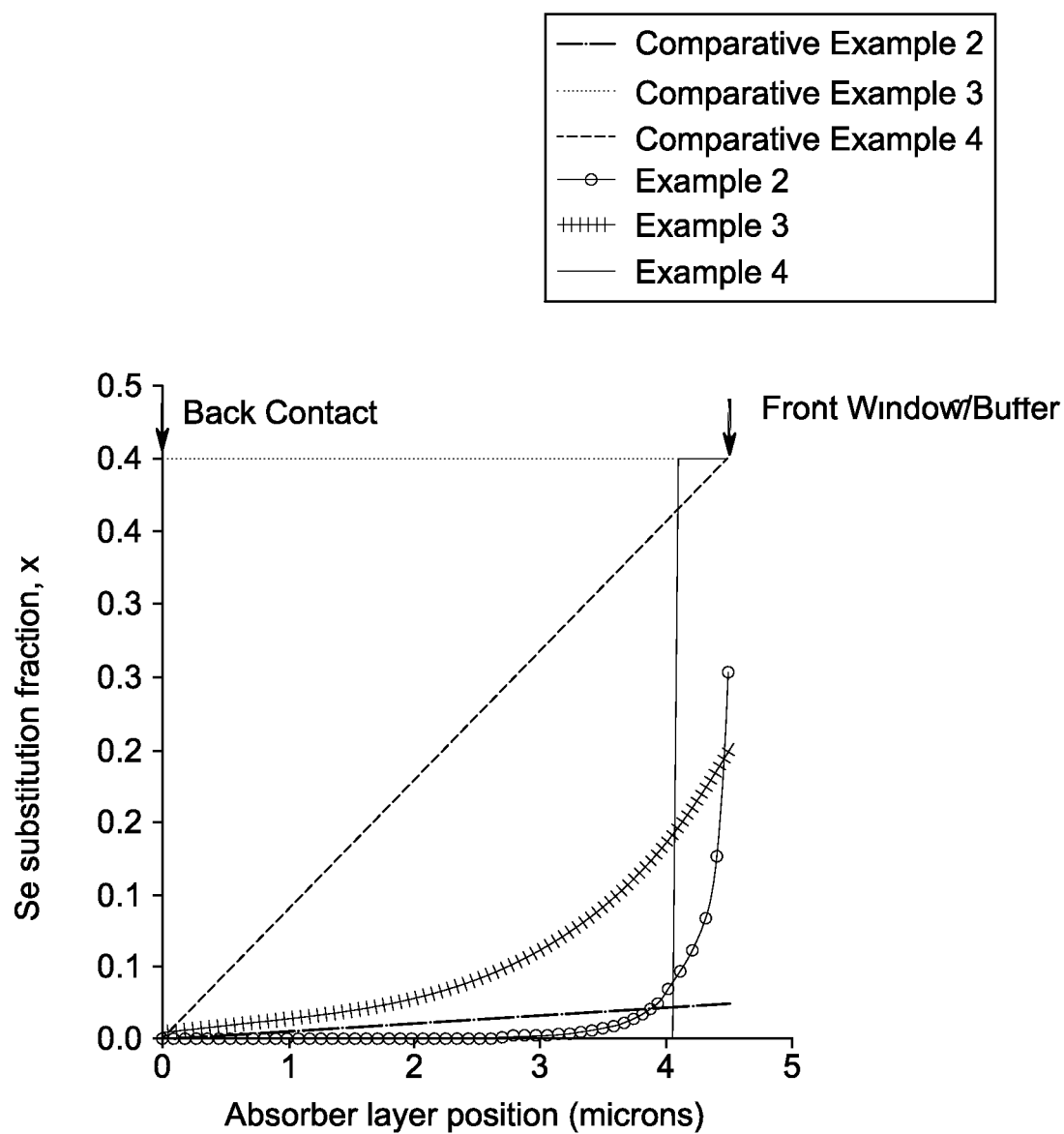
FIG. 11 shows the Se concentration as a function of depth, in accordance with some embodiments of the invention.

In some embodiments, the concentration of selenium varies continuously across the thickness of the absorber layer 120. Further, in such instances, the variation in the selenium concentration may be monotonic or non-monotonic. In certain embodiments, the concentration of selenium varies non-monotonically across a thickness of the absorber layer. In some instances, the rate-of-change in concentration may itself vary through the thickness, for example, increasing in some regions of the thickness, and decreasing in other regions of the thickness. A suitable selenium profile may include any higher order non-linear profile. Non-limiting examples of suitable selenium profiles include an exponential profile, a top-hat profile, a step-change profile, a square-wave profile, a power law profile (with exponent greater than 1 or less than 1), or combinations thereof. FIG. 11 illustrates a few examples of representative non-linear selenium profiles in the absorber layer 120. As will be appreciated by one of ordinary skill in the art, the profile of the selenium concentration may further vary after the processing steps, and the final device may include a diffused version of the profiles discussed here.

In some embodiments, the selenium concentration decreases across the thickness of the absorber layer 120, in a direction away from the layer stack 110. In some embodiments, the selenium concentration monotonically decreases across the thickness of the absorber layer 120, in a direction away from the layer stack 110. In some embodiments, the selenium concentration continuously decreases across a certain portion of the absorber layer 120 thickness, and is further substantially constant in some other portion of the absorber layer 120 thickness.

In certain embodiments, the absorber layer 120 includes a varying concentration of selenium such that there is lower concentration of selenium near the front interface (interface closer to the front contact) relative to the back interface (interface closer to the back contact). In certain embodiments, the absorber layer 120 includes a varying concentration of selenium such that there is higher concentration of selenium near the front interface (interface closer to the front contact) relative to the back interface (interface closer to the back contact).

In certain embodiments, the band gap in the absorber layer 120 may vary across a thickness of the absorber layer 120. In some embodiments, the concentration of selenium may vary across the thickness of the absorber layer 120 such that the band gap near the front interface is lower than the band gap near the back interface.

Without being bound by any theory, it is believed that a higher concentration of selenium near the front interface relative to the back interface may further allow for a higher fraction of incident radiation to be absorbed in the absorber layer 120. Moreover, selenium may improve the passivation of grain boundaries and interfaces, which can be seen through higher bulk lifetime and reduced surface recombination. Further, the lower band gap material near the front interface may enhance efficiency through photon confinement.

In some embodiments, the photovoltaic device 100 is substantially free of a cadmium sulfide layer. The term "substantially free of a cadmium sulfide layer" as used herein means that a percentage coverage of the cadmium sulfide layer (if present) on the underlying layer (for example, the interlayer or the buffer layer) is less than 20 percent. In some embodiments, the percentage coverage is in a range from about 0 percent to about 10 percent. In some embodiments, the percentage coverage is in a range from about 0 percent to about 5 percent. In certain embodiments, the photovoltaic device is completely free of the cadmium sulfide layer.

In certain embodiments, the absorber layer 120 may include a heterojunction. As used herein, a heterojunction is a semiconductor junction that is composed of layers/regions of dissimilar semiconductor material. These materials usually have non-equal band gaps. As an example, a heterojunction can be formed by contact between a layer or region having an excess electron concentration with a layer or region having an excess of hole concentration e.g., a "p-n" junction.

As will be appreciated by one of ordinary skill in the art, by varying the concentration of selenium in the absorber layer 120, a particular region of the absorber layer 120 may be rendered n-type and another region of the absorber layer 120 may be rendered p-type. In certain embodiments, the absorber layer 120 includes a "p-n" junction. The "p-n" junction may be formed between a plurality of regions of the absorber layer 120 having different band gaps. Without being bound by any theory, it is believed that the variation in selenium concentration may allow for a p-n junction within the absorber layer 120 or formation of a junction between the absorber layer and the underlying TCO layer.

In some embodiments, the photovoltaic device may further include a window layer (including a material such as CdS). In some embodiments, the absorber layer 120 may form a p-n junction with the underlying buffer layer or the window layer. As described earlier, the thickness of the window layer (including a material such as CdS) is typically desired to be minimized in a photovoltaic device to achieve high efficiency. With the presence of the varying concentration of selenium in the absorber layer, the thickness of the window layer (e.g., CdS layer) may be reduced or the window layer may be eliminated, to improve the performance of the present device. Moreover, the present device may achieve a reduction in cost of production because of the use of lower amounts of CdS or elimination of CdS.

Figure 2:
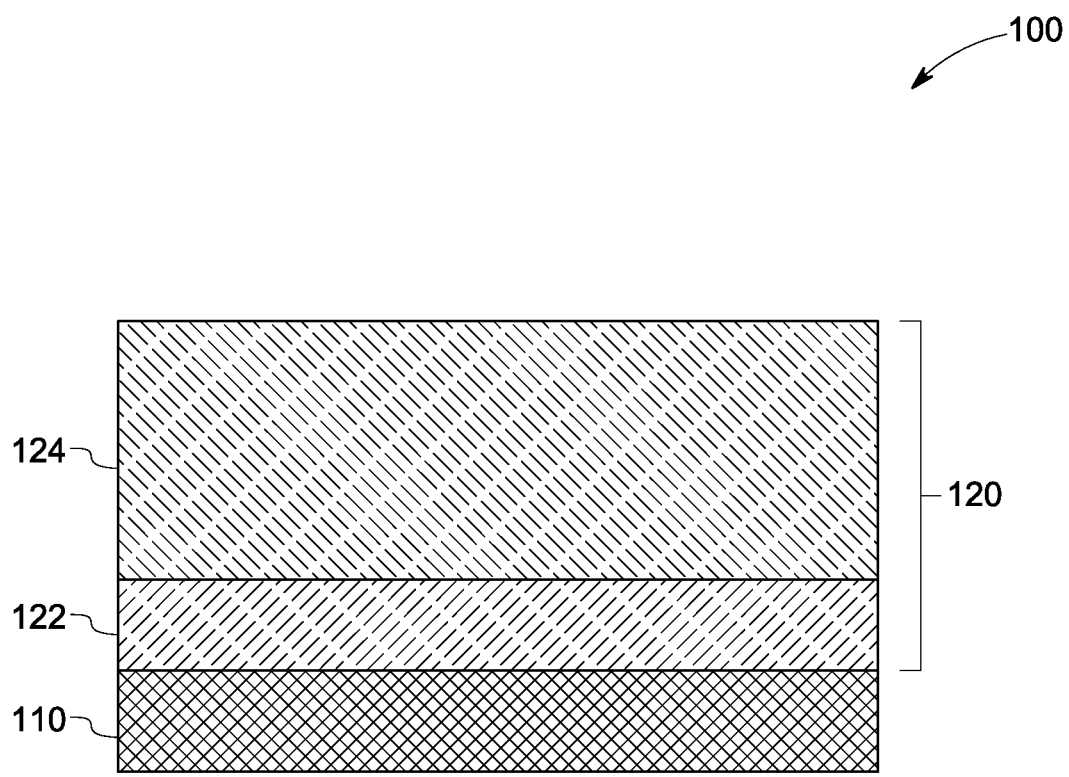
FIG. 2 is a schematic of a photovoltaic device, according to some embodiments of the invention.

In some embodiments, as indicated in FIG. 2, the absorber layer 120 includes a first region 122 and a second region 124. As illustrated in FIG. 2, the first region 122 is disposed proximate to the layer stack 110 relative to the second region 124. In some embodiments, an average atomic concentration of selenium in the first region 122 is greater than an average atomic concentration of selenium in the second region 124.

In some embodiments, the selenium concentration in the first region 122, the second region 124, or both the regions may further vary across the thickness of the respective regions. In some embodiments, the selenium concentration in the first region 122, the second region 124, or both the regions may continuously change across the thickness of the respective regions. As noted earlier, in some instances, the rate-of-rate-of-change in concentration may itself vary through the first region 122, the second region 124, or both the regions, for example, increasing in some portions, and decreasing in other portions.

In some embodiments, the selenium concentration in the first region 122, the second region 124, or both the regions may be substantially constant across the thickness of the respective regions. In some other embodiments, the selenium concentration may be substantially constant in at least a portion of the first region 122, the second region 124, or both the regions. The term "substantially constant" as used in this context means that the change in concentration is less than 5 percent across that portion or region.

The absorber layer 120 may be further characterized by the concentration of selenium present in the first region 122 relative to the second region 124. In some embodiments, a ratio of the average atomic concentration of selenium in the first region 122 to the average atomic concentration of selenium in the second region 124 is greater than about 2. In some embodiments, a ratio of the average atomic concentration of selenium in the first region 122 to the average atomic concentration of selenium in the second region 124 is greater than about 5. In some embodiments, a ratio of the average atomic concentration of selenium in the first region 122 to the average atomic concentration of selenium in the second region 124 is greater than about 10.

The first region 122 and the second region 124 may be further characterized by their thickness. In some embodiments, the first region 122 has a thickness in a range from about 1 nanometer to about 5000 nanometers. In some embodiments, the first region 122 has a thickness in a range from about 100 nanometers to about 3000 nanometers. In some embodiments, the first region 122 has a thickness in a range from about 200 nanometers to about 1500 nanometers. In some embodiments, the second region 124 has a thickness in a range from about 1 nanometer to about 5000 nanometers. In some embodiments, the second region 124 has a thickness in a range from about 100 nanometers to about 3000 nanometers. In some embodiments, the second region 124 has a thickness in a range from about 200 nanometers to about 1500 nanometers.

Referring again to FIG. 2, in some embodiments, the first region 122 has a band gap that is lower than a band gap of the second region 124. In such instances, the concentration of selenium in the first region 122 relative to the second region 124 may be in a range such that the band gap of the first region 122 is lower than the band gap of the second region 124.

The absorber layer 120 also includes a plurality of grains separated by grain boundaries. In some embodiments, an atomic concentration of selenium in the grain boundaries is higher than the atomic concentration of selenium in the grains.

Selenium may be present in the absorber layer 120, in its elemental form, as a dopant, as a compound, or combinations thereof. In certain embodiments, at least a portion of selenium is present in the absorber layer in the form of a compound. The term "compound", as used herein, refers to a macroscopically homogeneous material (substance) consisting of atoms or ions of two or more different elements in definite proportions, and at definite lattice positions. For example, cadmium, tellurium, and selenium have defined lattice positions in the crystal structure of a cadmium selenide telluride compound, in contrast, for example, to selenium-doped cadmium telluride, where selenium may be a dopant that is substitutionally inserted on cadmium sites, and not a part of the compound lattice In some embodiments, at least a portion of selenium is present in the absorber layer 120 in the form of a ternary compound, a quaternary compound, or combinations thereof. In some embodiments, the absorber layer 120 may further include cadmium and tellurium. In certain embodiments, at least a portion of selenium is present in the absorber layer in the form of a compound having a formula $CdSe_xTe_{1-x}$, wherein x is a number greater than 0 and less than 1. In some embodiments, x is in a range from about 0.01 to about 0.99, and the value of "x" varies across the thickness of the absorber layer 120.

In some embodiments, the absorber layer 120 may further include sulfur. In such instances, at least a portion of the selenium is present in the absorber layer 120 in the form of a quaternary compound including cadmium, tellurium, sulfur, and selenium. Further, as noted earlier, in such instances, the concentration of selenium may vary across a thickness of the absorber layer 120.

The absorber layer 120 may be further characterized by the amount of selenium present. In some embodiments, an average atomic concentration of selenium in the absorber layer 120 is in a range from about 0.001 atomic percent to about 40 atomic percent of the absorber layer 120. In some embodiments, an average atomic concentration of selenium in the absorber layer 120 is in a range from about 0.01 atomic percent to about 25 atomic percent of the absorber layer 120. In some embodiments, an average atomic concentration of selenium in the absorber layer 120 is in a range from about 0.1 atomic percent to about 20 atomic percent of the absorber layer 120.

As noted, the absorber layer 120 is a component of a photovoltaic device 100. In some embodiments, the photovoltaic device 100 includes a "superstrate" configuration of layers. Referring now to FIGS. 3-6, in such embodiments, the layer stack 110 further includes a support 111, and a transparent conductive oxide layer 112 (sometimes referred to in the art as a front contact layer) is disposed on the support 111. As further illustrated in FIGS. 3-6, in such embodiments, the solar radiation 10 enters from the support 111, and after passing through the transparent conductive oxide layer 112, the buffer layer 113, and optional intervening layers (for example, interlayer 114 and window layer 115) enters the absorber layer 120. The conversion of electromagnetic energy of incident light (for instance, sunlight) to electron-hole pairs (that is, to free electrical charge) occurs primarily in the absorber layer 120.

In some embodiments, the support 111 is transparent over the range of wavelengths for which transmission through the support 111 is desired. In one embodiment, the support 111 may be transparent to visible light having a wavelength in a range from about 400 nm to about 1000 nm. In some embodiments, the support 111 includes a material capable of withstanding heat treatment temperatures greater than about 600° C., such as, for example, silica or borosilicate glass. In some other embodiments, the support 111 includes a material that has a softening temperature lower than 600° C., such as, for example, soda-lime glass or a polyimide. In some embodiments certain other layers may be disposed between the transparent conductive oxide layer 112 and the support 111, such as, for example, an anti-reflective layer or a bather layer (not shown).

The term "transparent conductive oxide layer" as used herein refers to a substantially transparent layer capable of functioning as a front current collector. In some embodiments, the transparent conductive oxide layer 112 includes a transparent conductive oxide (TCO). Non-limiting examples of transparent conductive oxides include cadmium tin oxide ($Cd_2SnO_4$ or CTO); indium tin oxide (ITO); fluorine-doped tin oxide (SnO:F or FTO); indium-doped cadmium-oxide; doped zinc oxide (ZnO), such as aluminum-doped zinc-oxide (ZnO:Al or AZO), indium-zinc oxide (IZO), and zinc tin oxide ($ZnSnO_x$); or combinations thereof. Depending on the specific TCO employed and on its sheet resistance, the thickness of the transparent conductive oxide layer 112 may be in a range of from about 50 nm to about 600 nm, in one embodiment.

The term "buffer layer" as used herein refers to a layer interposed between the transparent conductive oxide layer 112 and the absorber layer 120, wherein the layer 113 has a higher sheet resistance than the sheet resistance of the transparent conductive oxide layer 112. The buffer layer 113 is sometimes referred to in the art as a "high-resistivity transparent conductive oxide layer" or "HRT layer".

Non-limiting examples of suitable materials for the buffer layer 113 include tin dioxide ($SnO_2$), zinc tin oxide (zinc-stannate (ZTO)), zinc-doped tin oxide ($SnO_2$:Zn), zinc oxide (ZnO), indium oxide ($In_2O_3$), or combinations thereof. In some embodiments, the thickness of the buffer layer 113 is in a range from about 50 nm to about 200 nm.

In some embodiments, as indicated in FIGS. 3-6, the layer stack 110 may further include an interlayer 114 disposed between the buffer layer 113 and the absorber layer 120. The interlayer may include a metal species. Non limiting examples of metal species include magnesium, gadolinium, aluminum, beryllium, calcium, barium, strontium, scandium, yttrium, hafnium, cerium, lutetium, lanthanum, or combinations thereof. The term "metal species" as used in this context refers to elemental metal, metal ions, or combinations thereof. In some embodiments, the interlayer 114 may include a plurality of the metal species. In some embodiments, at least a portion of the metal species is present in the interlayer 114 in the form of an elemental metal, a metal alloy, a metal compound, or combinations thereof. In certain embodiments, the interlayer 114 includes magnesium, gadolinium, or combinations thereof.

In some embodiments, the interlayer 114 includes (i) a compound including magnesium and a metal species, wherein the metal species includes tin, indium, titanium, or combinations thereof; or (ii) a metal alloy including magnesium; or (iii) magnesium fluoride; or combinations thereof. In certain embodiments, the interlayer includes a compound including magnesium, tin, and oxygen. In certain embodiments, the interlayer includes a compound including magnesium, zinc, tin, and oxygen.

Figure 3:
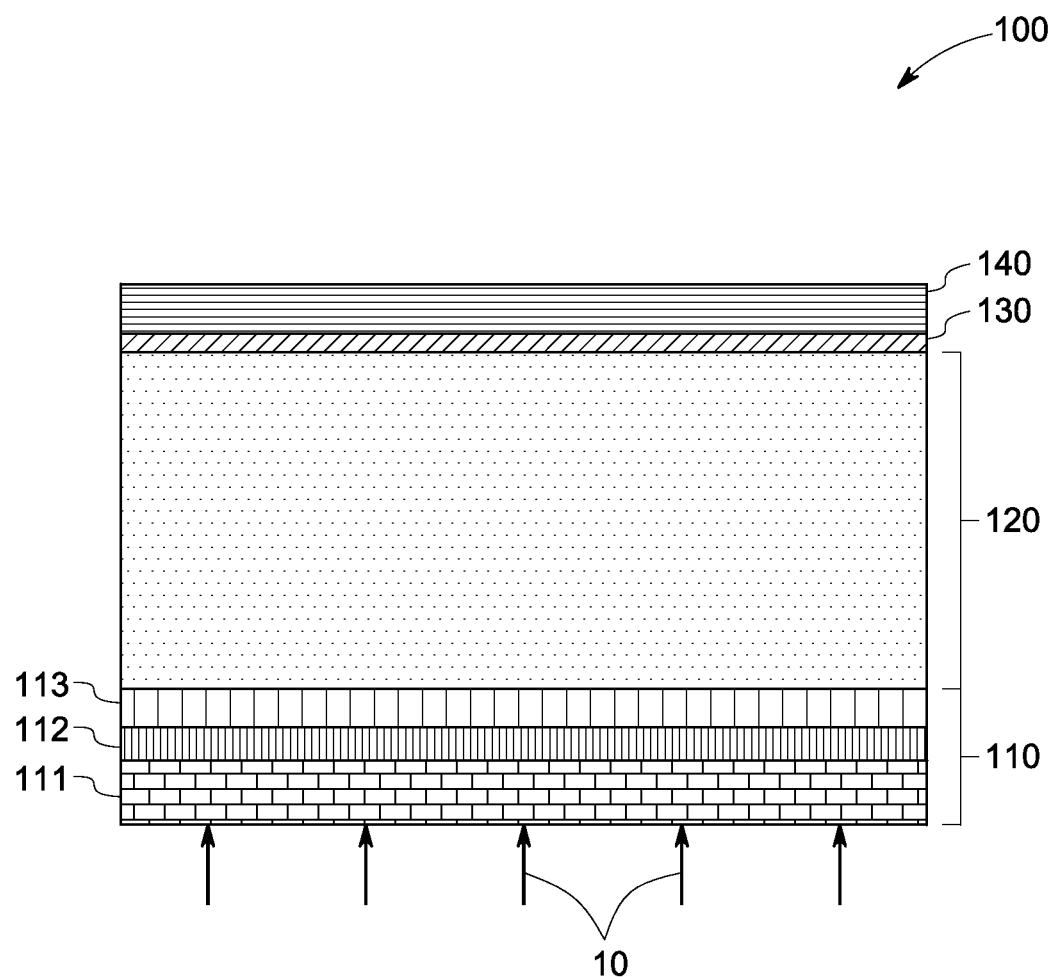
FIG. 3 is a schematic of a photovoltaic device, according to some embodiments of the invention.
Figure 4:
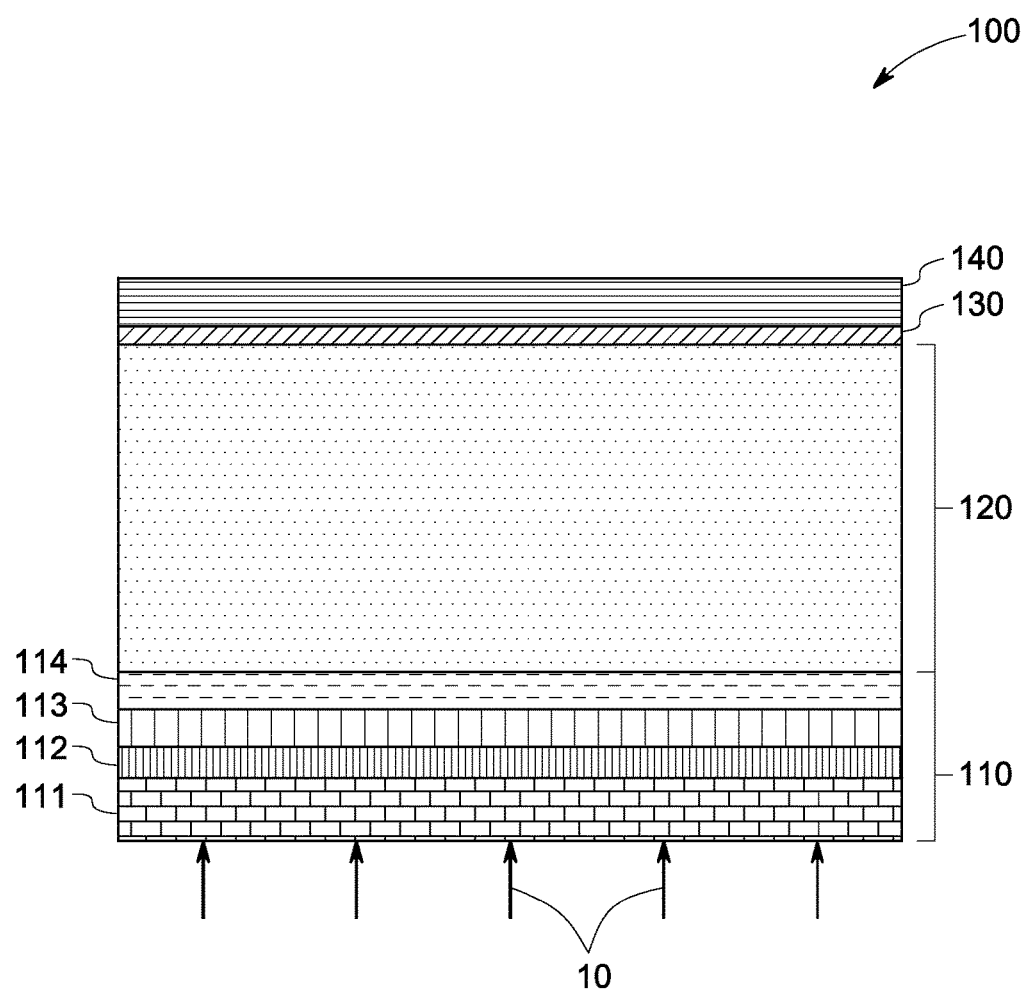
FIG. 4 is a schematic of a photovoltaic device, according to some embodiments of the invention.

As indicated in FIGS. 3 and 4, in certain embodiments, the absorber layer 120 is disposed directly in contact with the layer stack 110. However, as further noted earlier, in some embodiments, the photovoltaic device 100 may include a discontinuous cadmium sulfide layer interposed between the layer stack 110 and the absorber layer 120 (embodiment not shown). In such instances, the coverage of the CdS layer on the underlying layer (for example, interlayer 114 and the buffer layer 113) is less than about 20 percent. Further, at least a portion of the absorber layer 120 may contact the layer stack 110 through the discontinuous portions of the cadmium sulfide layer.

Figure 5:
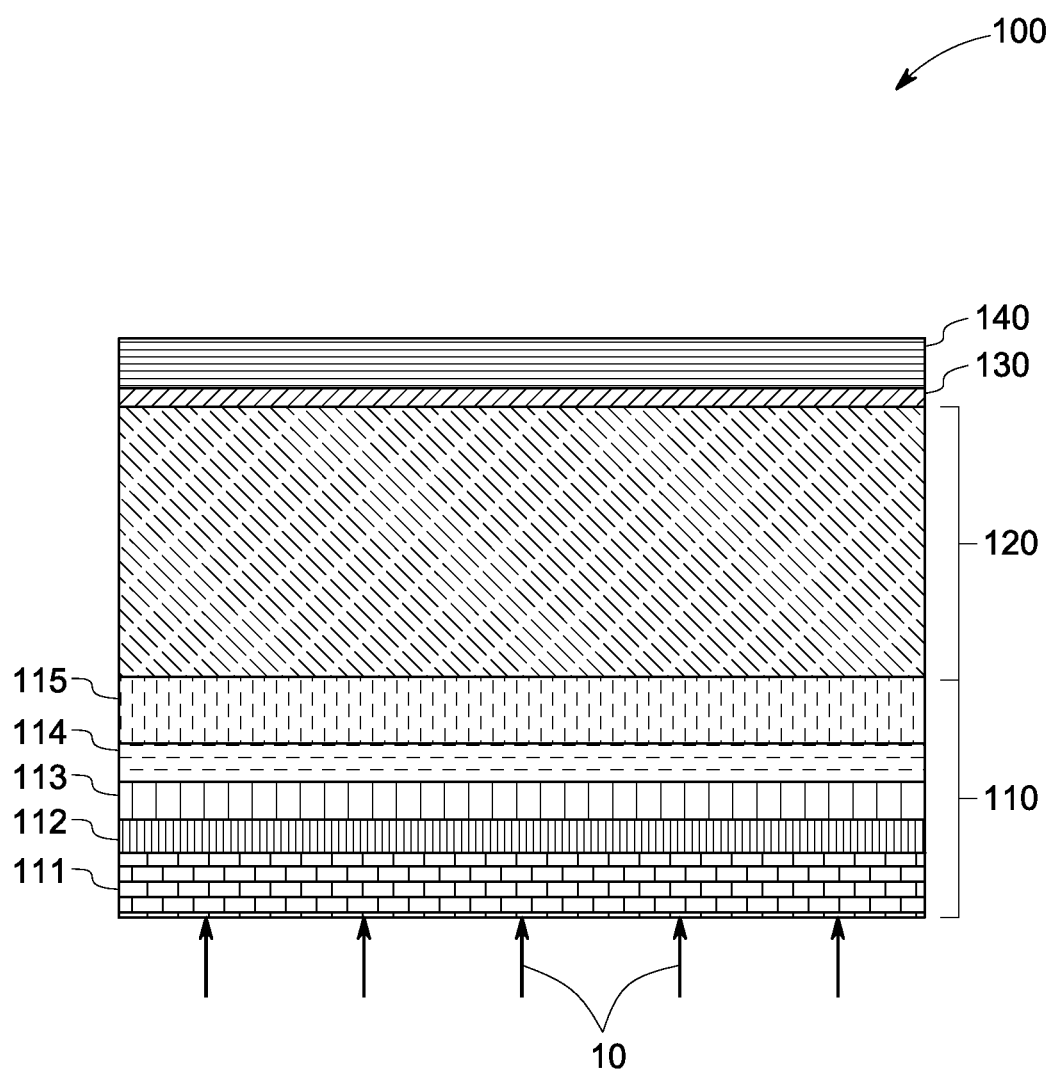
FIG. 5 is a schematic of a photovoltaic device, according to some embodiments of the invention.
Figure 6:
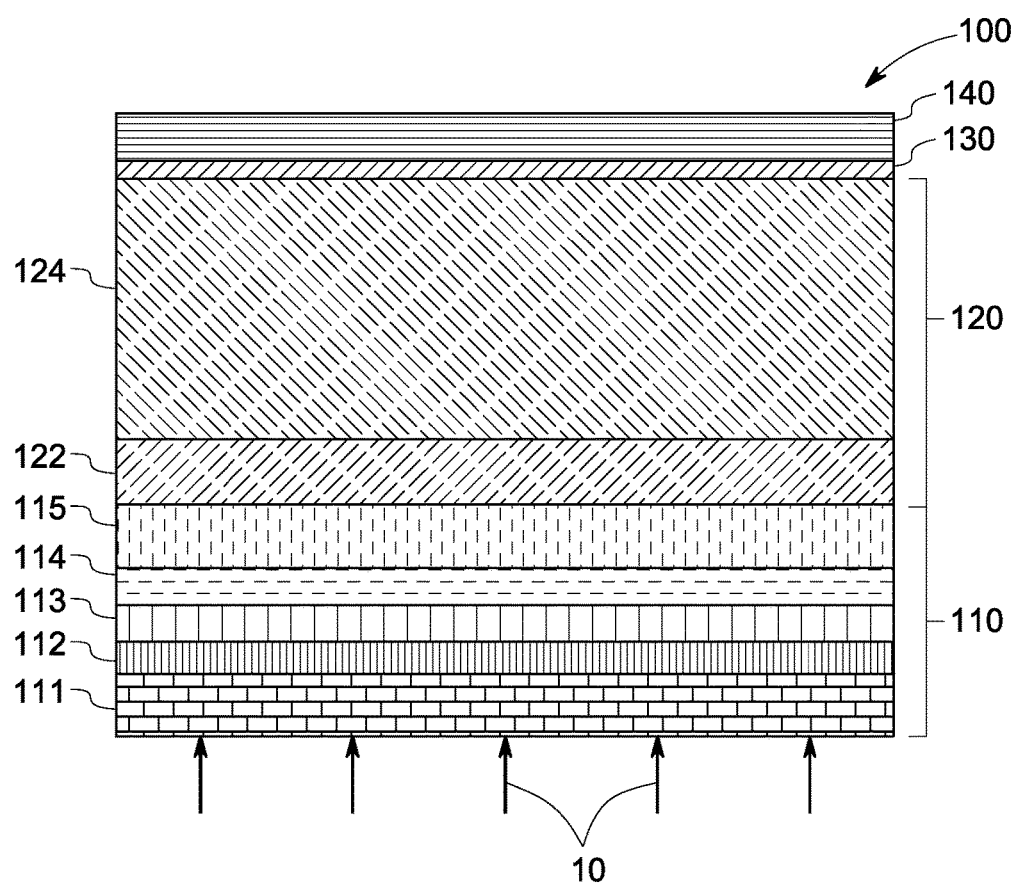
FIG. 6 is a schematic of a photovoltaic device, according to some embodiments of the invention.

Referring now to FIGS. 5 and 6, in some embodiments, the layer stack 110 may further include a window layer 115 disposed between the interlayer 114 and the absorber layer 120. The term "window layer" as used herein refers to a semiconducting layer that is substantially transparent and forms a heterojunction with an absorber layer 120. Non-limiting exemplary materials for the window layer 115 include cadmium sulfide (CdS), indium III sulfide ($In_2S_3$), zinc sulfide (ZnS), zinc telluride (ZnTe), zinc selenide (ZnSe), cadmium selenide (CdSe), oxygenated cadmium sulfide (CdS:O), copper oxide ($Cu_2O$), zinc oxihydrate (ZnO:H), or combinations thereof. In certain embodiments, the window layer 115 includes cadmium sulfide (CdS). In certain embodiments, the window layer 115 includes oxygenated cadmium sulfide (CdS:O).

In some embodiments, the absorber layer 120 may function as an absorber layer in the photovoltaic device 100. The term "absorber layer" as used herein refers to a semiconducting layer wherein the solar radiation is absorbed, with a resultant generation of electron-hole pairs. In one embodiment, the absorber layer 120 includes a p-type semiconductor material.

In one embodiment, a photoactive material is used for forming the absorber layer 120. Suitable photoactive materials include cadmium telluride (CdTe), cadmium zinc telluride (CdZnTe), cadmium magnesium telluride (CdMgTe), cadmium manganese telluride (CdMnTe), cadmium telluride sulfide (CdTeS), zinc telluride (ZnTe), lead telluride (PbTe), mercury cadmium telluride (HgCdTe), lead sulfide (PbS), or combinations thereof. The above-mentioned photoactive semiconductor materials may be used alone or in combination. Further, these materials may be present in more than one layer, each layer having different type of photoactive material, or having combinations of the materials in separate layers.

As will be appreciated by one of ordinary skill in the art, the absorber layer 120 as described herein further includes selenium. Accordingly, the absorber layer 120 may further include a combination of one or more of the aforementioned photoactive materials and selenium, such as, for example, cadmium selenide telluride, cadmium zinc selenide telluride, zinc selenide telluride, and the like. In certain embodiments, cadmium telluride is used for forming the absorber layer 120. In certain embodiments, the absorber layer 120 includes cadmium, tellurium, and selenium.

In some embodiments, the absorber layer 120 may further include sulfur, oxygen, copper, chlorine, lead, zinc, mercury, or combinations thereof. In certain embodiments, the absorber layer 120 may include one or more of the aforementioned materials, such that the amount of the material varies across a thickness of the absorber layer 120. In some embodiments, one or more of the aforementioned materials may be present in the absorber layer as a dopant. In certain embodiments, the absorber layer 120 further includes a copper dopant.

In some embodiments, the absorber layer 120, the window layer 115, or both the layers may contain oxygen. Without being bound by any theory, it is believed that the introduction of oxygen to the window layer 115 (e.g., the CdS layer) may result in improved device performance. In some embodiments, the amount of oxygen is less than about 20 atomic percent. In some instances, the amount of oxygen is between about 1 atomic percent to about 10 atomic percent. In some instances, for example in the absorber layer 120, the amount of oxygen is less than about 1 atomic percent. Moreover, the oxygen concentration within the absorber layer 120 may be substantially constant or compositionally graded across the thickness of the respective layer.

In some embodiments, the photovoltaic device 100 may further include a p+-type semiconductor layer 130 disposed on the absorber layer 120, as indicated in FIGS. 3-5. The term "p+-type semiconductor layer" as used herein refers to a semiconductor layer having an excess mobile p-type carrier or hole density compared to the p-type charge carrier or hole density in the absorber layer 120. In some embodiments, the p+-type semiconductor layer has a p-type carrier density in a range greater than about $1 \times 10^{16}$ per cubic centimeter. The p+-type semiconductor layer 130 may be used as an interface between the absorber layer 120 and the back contact layer 140, in some embodiments.

In one embodiment, the p+-type semiconductor layer 130 includes a heavily doped p-type material including amorphous Si:H, amorphous SiC:H, crystalline Si, microcrystalline Si:H, microcrystalline SiGe:H, amorphous SiGe:H, amorphous Ge, microcrystalline Ge, GaAs, BaCuSF, BaCuSeF, BaCuTeF, LaCuOS, LaCuOSe, LaCuOTe, LaSrCuOS, $LaCuOSe_{0.6}Te_{0.4}$, BiCuOSe, BiCaCuOSe, PrCuOSe, NdCuOS, $Sr_2Cu_2ZnO_2S_2$, $Sr_2CuGaO_3S$, $(Zn,Co,Ni)O_x$, or combinations thereof. In another embodiment, the p+-type semiconductor layer 130 includes a p+-doped material including zinc telluride, magnesium telluride, manganese telluride, beryllium telluride, mercury telluride, arsenic telluride, antimony telluride, copper telluride, elemental tellurium or combinations thereof. In some embodiments, the p+-doped material further includes a dopant including copper, gold, nitrogen, phosphorus, antimony, arsenic, silver, bismuth, sulfur, sodium, or combinations thereof.

In some embodiments, the photovoltaic device 100 further includes a back contact layer 140, as indicated in FIGS. 3-5. In some embodiments, the back contact layer 140 is disposed directly on the absorber layer 120 (embodiment not shown). In some other embodiments, the back contact layer 140 is disposed on the p+-type semiconductor layer 130 disposed on the absorber layer 120, as indicated in FIGS. 3-5.

In some embodiments, the back contact layer 140 includes gold, platinum, molybdenum, tungsten, tantalum, titanium, palladium, aluminum, chromium, nickel, silver, graphite, or combinations thereof. The back contact layer 140 may include a plurality of layers that function together as the back contact.

In some embodiments, another metal layer (not shown), for example, aluminum, may be disposed on the back contact layer 140 to provide lateral conduction to the outside circuit. In certain embodiments, a plurality of metal layers (not shown), for example, aluminum and chromium, may be disposed on the back contact layer 140 to provide lateral conduction to the outside circuit. In certain embodiments, the back contact layer 140 may include a layer of carbon, such as, graphite deposited on the absorber layer 120, followed by one or more layers of metal, such as the metals described above.

Referring again to FIG. 6, as indicated, the absorber layer 120 further includes a first region 122 and a second region 124. As further illustrated in FIG. 6, the first region 122 is disposed proximate to the layer stack 110 relative to the second region 124. In some embodiments, the first region 122 is disposed directly in contact with the window layer 115. In some embodiments, the first region 122 is disposed directly in contact with the buffer layer 113 (embodiment not shown). Further, as discussed earlier, an average atomic concentration of selenium in the first region 122 is greater than an average atomic concentration of selenium in the second region 124. In other embodiments, an average atomic concentration of selenium in the first region 122 is lower than an average atomic concentration of selenium in the second region 124.

Figure 7:
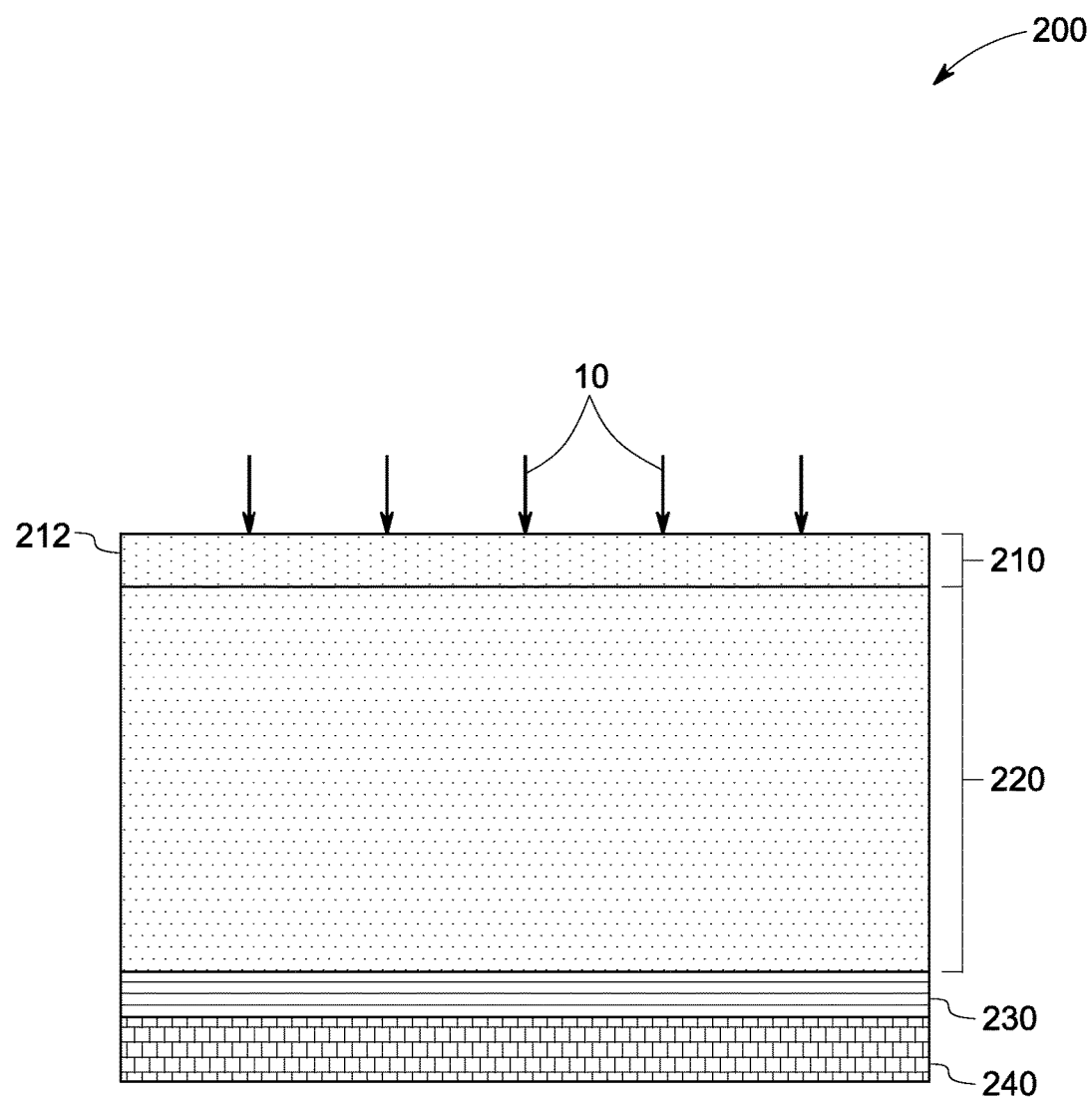
FIG. 7 is a schematic of a photovoltaic device, according to some embodiments of the invention.

In alternative embodiments, as illustrated in FIG. 7, a photovoltaic device 200 including a "substrate" configuration is presented. The photovoltaic device 200 includes a layer stack 210 and an absorber layer 220 disposed on the layer stack. The layer stack 210 includes a transparent conductive oxide layer 212 disposed on the absorber layer, as indicated in FIG. 7. The absorber layer 220 is further disposed on a back contact layer 230, which is disposed on a substrate 240. As illustrated in FIG. 7, in such embodiments, the solar radiation 10 enters from the transparent conductive oxide layer 212 and enters the absorber layer 220, where the conversion of electromagnetic energy of incident light (for instance, sunlight) to electron-hole pairs (that is, to free electrical charge) occurs.

In some embodiments, the composition of the layers illustrated in FIG. 7, such as, the substrate 240, the transparent conductive oxide layer 212, the absorber layer 220, and the back contact layer 230 may have the same composition as described above in FIG. 5 for the superstrate configuration.

A method of making a photovoltaic device is also presented. In some embodiments, the method generally includes providing an absorber layer on a layer stack, wherein the absorber layer includes selenium, and wherein an atomic concentration of selenium varies non-linearly across a thickness of the absorber layer. With continued reference to FIGS. 1-6, in some embodiments the method includes providing an absorber layer 120 on a layer stack 110.

In some embodiments, as indicated in FIG. 2, the step of providing an absorber layer 120 includes forming a first region 122 and a second region 124 in the absorber layer 120, the first region 122 disposed proximate to the layer stack 110 relative to the second region 124. As noted earlier, in some embodiments, an average atomic concentration of selenium in the first region 122 is greater than an average atomic concentration of selenium in the second region 124.

The absorber layer 120 may be provided on the layer stack 110 using any suitable technique. In some embodiments, the step of providing an absorber layer 120 includes contacting a semiconductor material with a selenium source. The terms "contacting" or "contacted" as used herein means that at least a portion of the semiconductor material is exposed to, such as, in direct physical contact with a suitable selenium source in a gas, liquid, or solid phase. In some embodiments, a surface of the absorber layer may be contacted with the suitable selenium source, for example using a surface treatment technique. In some other embodiments, the semiconductor material may be contacting with a suitable selenium source, for example, using an immersion treatment.

In some embodiments, the semiconductor material includes cadmium. Non-limiting examples of a suitable semiconductor material include cadmium telluride (CdTe), cadmium zinc telluride (CdZnTe), cadmium magnesium telluride (CdMgTe), cadmium manganese telluride (CdMnTe), cadmium sulfur telluride (CdSTe), zinc telluride (ZnTe), lead telluride (PbTe), lead sulfide (PbS), mercury cadmium telluride (HgCdTe), or combinations thereof. In certain embodiments, the semiconductor material includes cadmium and tellurium.

The term "selenium source" as used herein refers to any material including selenium. Non-limiting examples of a suitable selenium source include elemental selenium, cadmium selenide, oxides of cadmium selenide, such as, for example, cadmium selenite ($CdSeO_3$), hydrogen selenide, organo-metallic selenium, or combinations thereof.

The portion of the semiconductor material contacted with the selenium source may depend, in part, on the physical form of the selenium source during the contacting step. In some embodiments, the selenium source is in the form of a solid (for example, a layer), a solution, a suspension, a paste, vapor, or combinations thereof. Thus, by way of example, in some embodiments, for example, the selenium source may be in the form of a solution, and the method may include soaking at least a portion of the semiconductor material in the solution.

In some embodiments, the selenium source may be in the form a vapor, and the method may include depositing the selenium source using a suitable vapor deposition technique. In some embodiments, for example, the absorber layer 120 may be heat treated in the presence of a selenium source (for example, selenium vapor) to introduce selenium into at least a portion of the absorber layer 120.

In some embodiments, for example, the selenium source may be in the form of a layer, and the method may include depositing a selenium source layer on the semiconductor material, or, alternatively, depositing the semiconductor material on a layer of the selenium source. In some such embodiments, the method may further include subjecting the semiconductor material to one or more post-processing steps to introduce the selenium into the semiconductor material.

Figure 8:
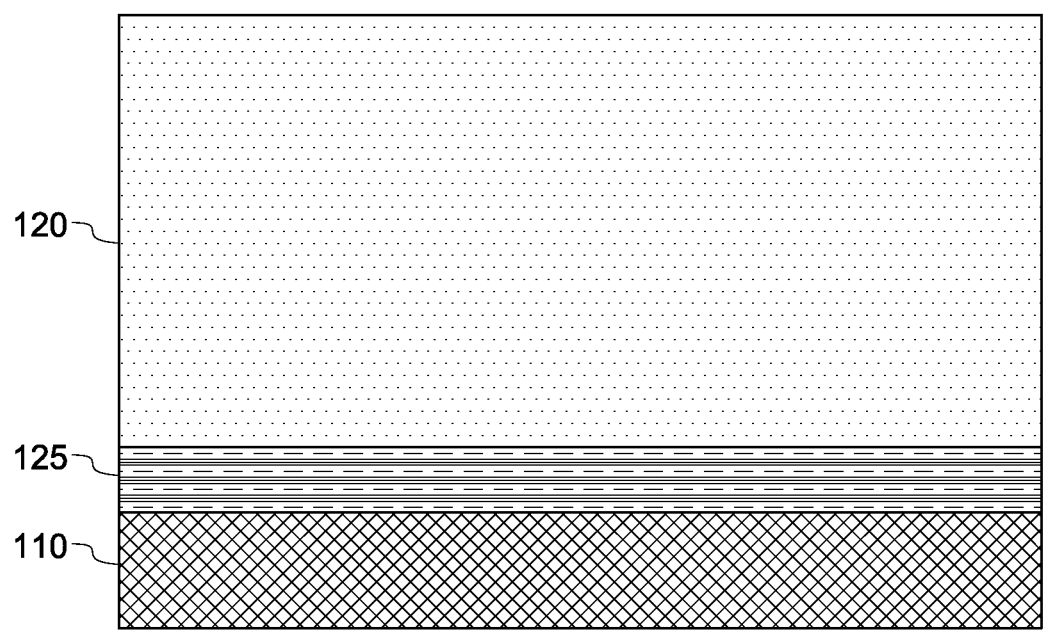
FIG. 8 is a schematic of a method of making a photovoltaic device, according to some embodiments of the invention.

Referring now to FIG. 8, in some embodiments, the step of providing an absorber layer includes (a) disposing a selenium source layer 125 on the layer stack 110; (b) disposing an absorber layer 120 on the selenium source layer 125; and (c) introducing selenium into at least a portion of the absorber layer 120. It should be noted, that the steps (b) and (c) may be performed sequentially or simultaneously.

In some embodiments, the selenium source layer 125 may be disposed on the layer stack 110 using any suitable deposition technique, such as, for example, sputtering, sublimation, evaporation, or combinations thereof. The deposition technique may depend, in part, on one or more of the selenium source material, the selenium source layer 125 thickness, and the layer stack 110 composition. In certain embodiments, the selenium source layer 125 may include elemental selenium and the selenium source layer 125 may be formed by evaporation. In certain embodiments, the selenium source layer 125 may include cadmium selenide, and the selenium source layer 125 may be formed by sputtering, evaporation, or sublimation.

The selenium source layer may include a single selenium source layer or a plurality of selenium source layers. The selenium source may be the same or different in the plurality of source layers. In some embodiments, the selenium source layer includes a plurality of selenium source layers, such as, for example, a stack of elemental selenium layer and a cadmium selenide layer, or vice versa.

The selenium source layer 125 may have a thickness in a range from about 1 nanometer to about 1000 nanometers. In some embodiments, the selenium source layer 125 has a thickness in a range from about 10 nanometers to about 500 nanometers. In some embodiments, the selenium source layer 125 has a thickness in a range from about 15 nanometers to about 250 nanometers.

As noted, the method further includes disposing an absorber layer 120 on the selenium source layer 125. In some embodiments, the absorber layer 120 may be deposited using a suitable method, such as, close-space sublimation (CSS), vapor transport deposition (VTD), ion-assisted physical vapor deposition (IAPVD), radio frequency or pulsed magnetron sputtering (RFS or PMS), chemical vapor deposition (CVD), plasma enhanced chemical vapor deposition (PECVD), or electrochemical deposition (ECD).

The method further includes introducing selenium into at least a portion of the absorber layer 120. In some embodiments, the method includes introducing selenium into at least a portion of the absorber layer 120 such that a concentration of selenium varies non-linearly across the thickness of the absorber layer 120.

In some embodiments, at least a portion of selenium is introduced in the absorber layer 120 simultaneously with the step of disposing the absorber layer 120. In some embodiments, at least a portion of selenium may be introduced after the step of disposing the absorber layer 120, for example, during the cadmium chloride treatment step, during the p+-type layer formation step, during the back contact formation step, or combinations thereof.

In some embodiments, the step of providing an absorber layer 120 includes co-depositing a selenium source material and a semiconductor material. Suitable non-limiting examples of co-deposition include co-sputtering, co-sublimation, or combinations thereof. Non-limiting examples of a suitable selenium source material in such instance includes elemental selenium, cadmium selenide, hydrogen selenide, cadmium telluride selenide, or combinations thereof. Thus, by way of example, in some embodiments, an absorber layer 120 may be provided by depositing the semiconductor material in the presence of selenium source (for example, selenium containing vapor or hydrogen selenide vapor).

In some embodiments, the absorber layer 120 may be provided by sputtering from a single target (for example, cadmium selenide telluride target) or a plurality of targets (for example, cadmium telluride and cadmium selenide targets). As will be appreciated by one of ordinary skill in the art, the concentration of selenium in the absorber layer 120 may be varied by controlling one or both of target(s) composition and sputtering conditions.

As noted earlier, the photovoltaic device 100 and the layer stack 110 may further include one or more additional layers, for example, a support 111, a transparent conductive oxide layer 112, a buffer layer 113, an interlayer 114, a p+-type semiconductor layer 130, and a back contact layer 140, as depicted in FIGS. 3-5.

As understood by a person skilled in the art, the sequence of disposing the three layers or the whole device may depend on a desirable configuration, for example, "substrate" or "superstrate" configuration of the device.

In certain embodiments, a method for making a photovoltaic 100 in superstrate configuration is described. Referring now to FIGS. 3-6, in some embodiments, the method further includes disposing the transparent conductive oxide layer 112 on a support 111. The transparent conductive oxide layer 112 is disposed on the support 111 by any suitable technique, such as sputtering, chemical vapor deposition, spin coating, spray coating, or dip coating. Referring again to FIGS. 3-6, in some embodiments, a buffer layer 113 may be deposited on the transparent conductive oxide layer 112 using sputtering. The method may further including disposing an interlayer 114 on the buffer layer 113 to form a layer stack 110, as indicated in FIG. 4.

The method may further include disposing a window layer 115 on the interlayer 114 to form a layer stack 110, as indicated in FIGS. 5 and 6. Non-limiting examples of the deposition methods for the window layer 115 include one or more of close-space sublimation (CSS), vapor transport deposition (VTD), sputtering (for example, direct current pulse sputtering (DCP), electro-chemical deposition (ECD), and chemical bath deposition (CBD).

The method further includes providing an absorber layer 120 on the layer stack 110, as described in detail earlier. In some embodiments, a series of post-forming treatments may be further applied to the exposed surface of the absorber layer 120. These treatments may tailor the functionality of the absorber layer 120 and prepare its surface for subsequent adhesion to the back contact layer(s) 140. For example, the absorber layer 120 may be annealed at elevated temperatures for a sufficient time to create a quality p-type layer. Further, the absorber layer 120 may be treated with a passivating agent (e.g., cadmium chloride) and a tellurium-enriching agent (for example, iodine or an iodide) to form a tellurium-rich region in the absorber layer 120. Additionally, copper may be added to absorber layer 120 in order to obtain a low-resistance electrical contact between the absorber layer 120 and a back contact layer(s) 140.

Referring again to FIGS. 3-6, a p+-type semiconducting layer 130 may be further disposed on the absorber layer 120 by depositing a p+-type material using any suitable technique, for example PECVD or sputtering. In an alternate embodiment, as mentioned earlier, a p+-type semiconductor region may be formed in the absorber layer 120 by chemically treating the absorber layer 120 to increase the carrier density on the back-side (side in contact with the metal layer and opposite to the window layer) of the absorber layer 120 (for example, using iodine and copper). In some embodiments, a back contact layer 140, for example, a graphite layer may be deposited on the p+-type semiconductor layer 130, or directly on the absorber layer 120 (embodiment not shown). A plurality of metal layers may be further deposited on the back contact layer 140.

One or more of the absorber layer 120, the back contact layer 140, or the p+-type layer 130 (optional) may be further heated or subsequently treated (for example, annealed) after deposition to manufacture the photovoltaic device 100.

In some embodiments, other components (not shown) may be included in the exemplary photovoltaic device 100, such as, buss bars, external wiring, laser etches, etc. For example, when the device 100 forms a photovoltaic cell of a photovoltaic module, a plurality of photovoltaic cells may be connected in series in order to achieve a desired voltage, such as through an electrical wiring connection. Each end of the series connected cells may be attached to a suitable conductor such as a wire or bus bar, to direct the generated current to convenient locations for connection to a device or other system using the generated current. In some embodiments, a laser may be used to scribe the deposited layers of the photovoltaic device 100 to divide the device into a plurality of series connected cells.

EXAMPLES

Example 1

Method of Fabricating a Photovoltaic Device with a Non-linear Gradient Profile A cadmium telluride photovoltaic device was made by depositing several layers on a cadmium tin oxide (CTO) transparent conductive oxide (TCO)-coated substrate. The substrate was a 1.4 millimeters thick PVN++ glass, which was coated with a CTO transparent conductive oxide layer and a thin high resistance transparent zinc tin oxide (ZTO) buffer layer. A magnesium-containing capping layer was then deposited on the ZTO buffer layer to form an interlayer. The window layer (approximately 40 nanometers thick) containing cadmium sulfide (CdS:O, with approximately 5 molar % oxygen in the CdS layer) was then deposited on the interlayer by DC sputtering and then annealed at an elevated temperature. An approximately 500 nm thick Cd(Te,Se) film was then deposited by close space sublimation from a source material with a Se/(Se+Te) ratio of approximately 40%. The pressure was fixed at approximately 15 Torr with a small amount of oxygen in the He background gas. After deposition, the stack was treated with $CdCl_2$ and then baked at temperature greater than 400° C. Following the bake excess $CdCl_2$ was removed. Approximately 3.5 microns CdTe film was then deposited by close space sublimation in the presence of about 1 Torr of $O_2$. After the second deposition, a second $CdCl_2$ treatment and subsequent bake followed by removal of excess $CdCl_2$ was performed before forming a back contact.

Figure 9:
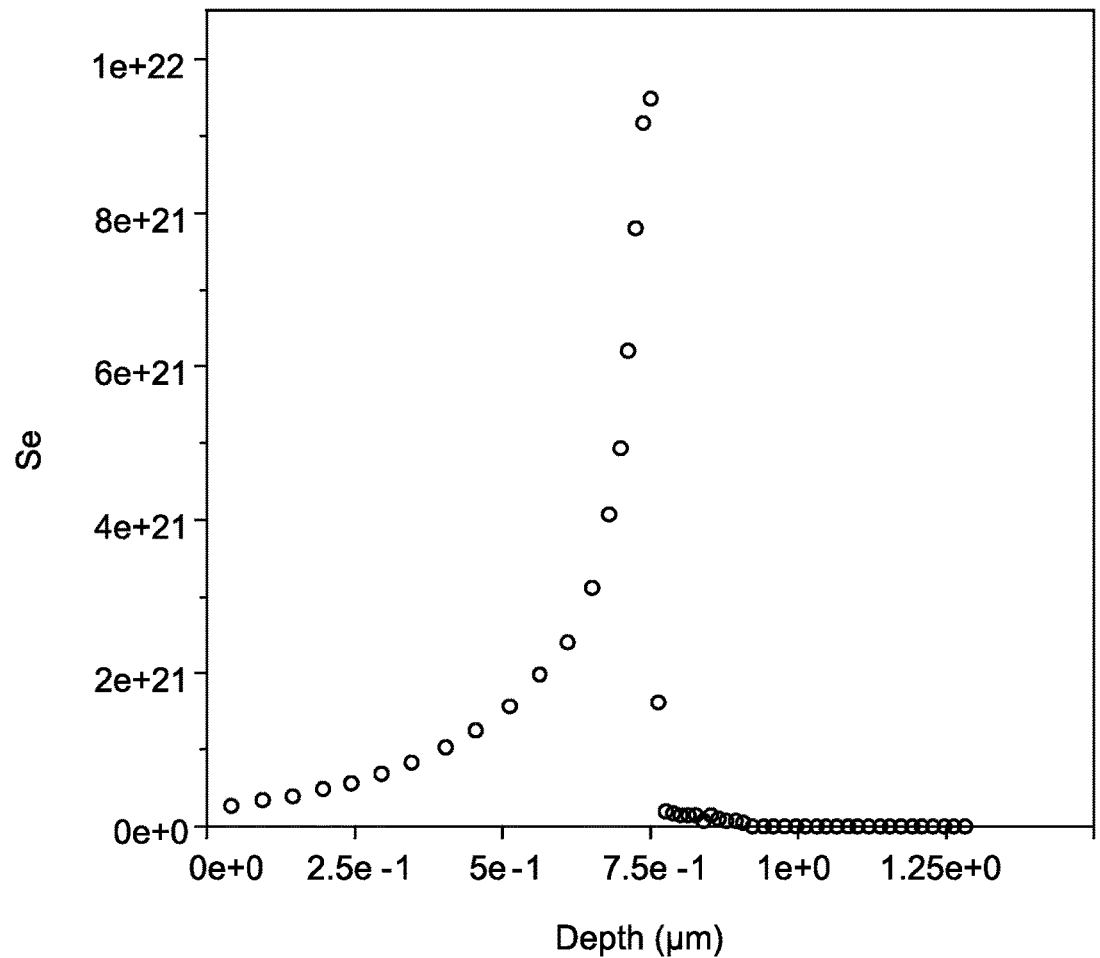
FIG. 9 shows the Se concentration as a function of depth, in accordance with one embodiment of the invention.

The Se deposition profile in the device was measured using dynamic secondary ion mass spectroscopy (DSIMS) performed. Prior to the measurement, the samples were polished to reduce the effects of surface roughness. The results for Se ion concentration (in atoms/cm$^3$) are shown in FIG. 9. The peak of the Se concentration is near the location window and buffer layers. The depth axis is the distance in microns from the polished edge of the sample. Since the polishing procedure removes some amount of CdTe, the total thickness of the alloy layer is less than the thickness of the Cd(Se)Te alloy layer of the original solar cell.

Figure 10:
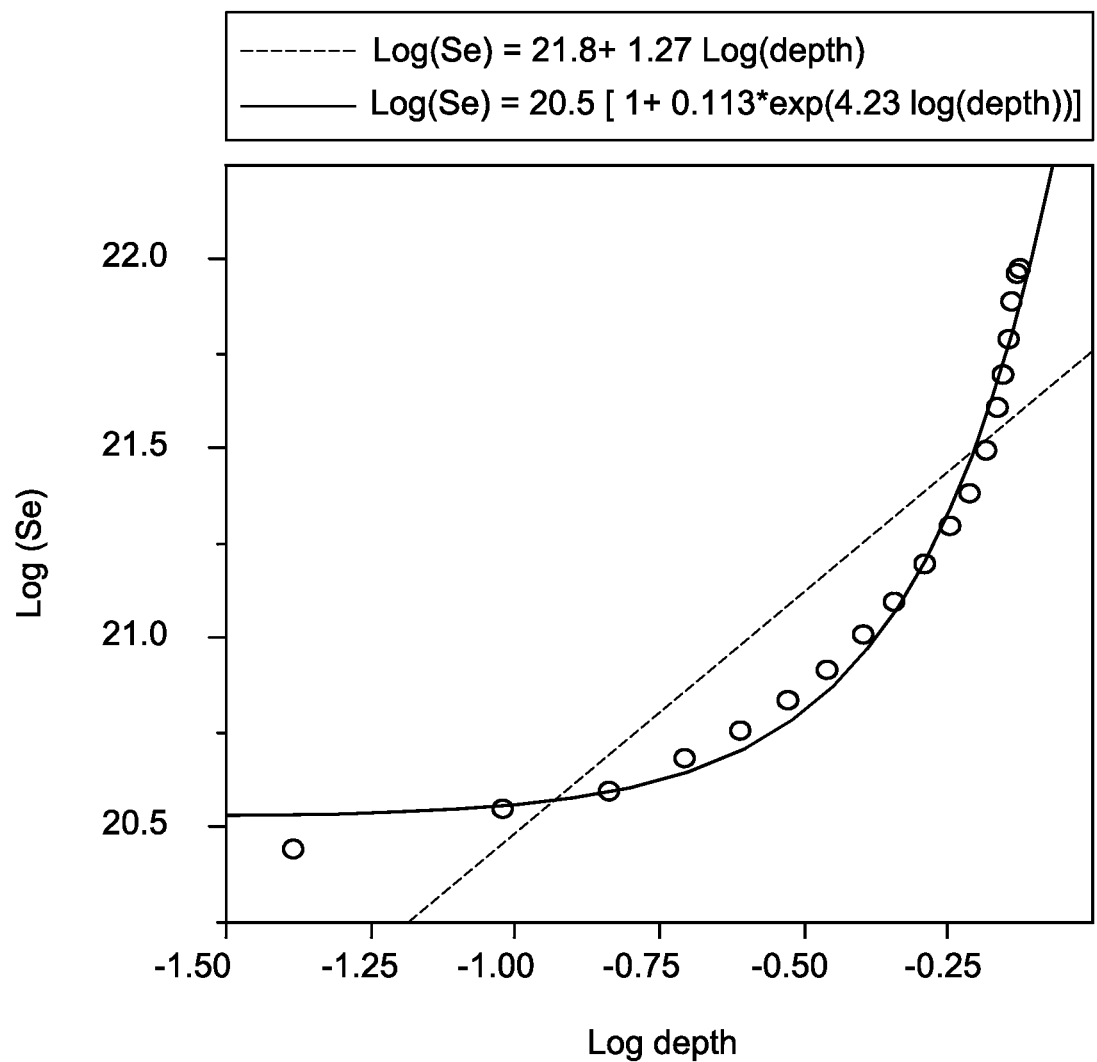
FIG. 10 shows the log-log plot of Se concentration as a function of depth, in accordance with one embodiment of the invention.

To assess the non-linear nature of the distribution of the Se within the absorber layer the data was filtered to remove points after the peak of the Se distribution in the in data. The data was then plotted on a log-log plot. The data is shown in FIG. 10. Two functions were fitted on the log-log plot: one a linear fit which a slope of 1.27, which is indicative of super-linear distribution. Since the overall fit quality was poor, the log-log data was also fit to an exponentially rising function, which gave a significantly better fit indicating that the measured Se distribution is highly non-linear.

Examples 2-4

Simulation Tests for Different Non-linear Se Concentration Profiles in a CdTe Layer To illustrate some of the non-linear profiles, simulations were carried out using the one-dimensional solar cell simulation program SCAPS v.3.2.01 (M. Burgelman, P. Nollet and S. Degrave, "Modelling polycrystalline semiconductor solar cells", Thin Solid Films 361-362 (2000), pp. 527-532) The program numerically solves the Poisson and continuity equations for electrons and holes in a single dimension to determine the band-diagram of the device and its response to illumination, voltage bias, and temperature. Performance calculations were made using simulated IV sweeps in the simulation under illumination by the AM1.5G spectrum at 100 mW/cm$^2$ of intensity and 300K, also known as Standard Test Conditions (STC). The model parameters for CdTe and device design were set according to the parameters given by Gloeckler et. al. for CdTe solar cells. (M. Gloeckler, A. Fahrenbruch and J. Sites, "Numerical modeling of CIGS and CdTe solar cells: setting the baseline", Proc. 3rd World Conference on Photovoltaic Energy Conversion (Osaka, Japan, may 2003), pp. 491-494, WCPEC-3, Osaka (2003)), except that the CdTe absorber layer thickness was increased to 4.5 microns and the nature of the deep trap in the CdTe absorber layers was changed from 'donor' to neutral. The CdSe parameters were set to have the same values as the CdTe parameters, except that the deep trap density in the CdSe is a factor of ten lower and the band gap is 1.7 eV. A model for the variation in the properties of the alloy material $CdTe_{1-x}Se_x$ as a function of x, the faction Se substitution, was constructed. The model assumes that the Eg of the CdTe is equal to 1.5 eV, the gap of the CdSe is equal to 1.7 and a bowing parameter, b=0.8. The band gap of the alloy is given by:

$$E_{g,alloy}=xE_{g,CdSe}+(1-x)E_{g,CdTe}+bx(1-x).$$

The other material properties, such as carrier mobilities and dielectric constant values were assumed to be independent of alloy composition and the deep donor concentration varied linearly between the CdTe and CdSe values as function of x.

In Example 2, simulation was conducted using the measured DSIMS Se profile as input. The measured DSIMS profile was fit to a bi-exponential decay profile and the parameters from the fit used to calculate a Se concentration profile throughout the 4.5 micron thickness of the absorber layer.

In Example 3, an exponential Se concentration profile was assumed, rising from about x=0.006 in the back to 0.2 in the front. The total amount of Se in the device was about 4.4 times that of the device described in Example 1.

In Example 4, a top-hat Se concentration profile was assumed. In the particular top-hat profile, x=0 from the back of the device until about 0.4 microns from the front interface, whereupon it rises. From this point, x=0.4 until the front of the absorber layer is reached. The total amount of Se in the device was about 3 times that of the device described in Example 1.

Comparative Example 1

Simulation Test for a Conventional CdS/CdTe Photovoltaic Device

For this simulation, the device had no Se and used the inputs as specified by Gloeckler except for the modifications noted previously. The calculated performance metrics of this model cell (efficiency, Voc, Jsc, and fill factor (FF)) were used as the reference levels for the other examples and their respective performance metrics were normalized to this baseline case.

Comparative Example 2

Simulation Test for a Linear Se Concentration Profile in CdTe Layer

For this simulation, a linear Se concentration profile was used assuming the same total amount of Se as determined via the DSIMS profile. In this calculation, a linear gradient in Se concentration was input into the device model. The value of x was set to 0 at the back contact and to about 0.025 in front.

Comparative Example 3

Simulation Test for a Constant Se Concentration Profile in CdTe Layer

For this simulation, a constant Se concentration profile with x=0.4 was assumed throughout the absorbing layer of the device. The total amount of Se in the device was about 32 times that of the device described in Example 1.

Comparative Example 4

Simulation Test for a Linear Se Concentration Profile in CdTe Layer

For this simulation, the Se concentration profile was assumed to be a linear ramp starting from x=0 at the back contact and rising to x=0.4 at the front of the device. The total amount of Se in the device is about 16 times that of the device described in Example 1.

The performance metrics of Examples 2-4 and Comparative Examples 2-4 relative to the baseline cell of Comparative Example 1 are reported in Table 1. FIG. 11 shows the Se concentration profile as a function of CdTe thickness for Comparative Examples 2-4 and Examples 2-4.

As illustrated in Table 1, the device performance parameters showed improvement for the devices with a non-linear graded CdTeSe layer (Examples 2-4) when compared to the device without a CdTeSe layer (Comparative Example 1). For the same amount of Se, the device performance parameters further showed improvement for the devices with a non-linear graded CdTeSe layer (Example 2) when compared to the device with a linear gradient of Se in CdTeSe layer (Comparative Example 2). Both the 'exponential' and 'top-hat' non-linear Se concentration profiles (Examples 3-4) demonstrated superior efficiency to cells that had either constant or linearly graded Se concentration profiles (Comparative Examples 3 and 4), despite have a much lower total amount of Se present in the layer.

It should be noted that while the profiles in the example set are primarily confined the front, some degree of shifting of the Se profile may lead to improvement in overall device performance, particularly if the doping profiles or the energy levels of the front and back contacts are adjusted. In such cases it is possible that optimal position of the peak of the Se is not at the front interface next to the buffer layer.

TABLE 1

Simulation results for performance parameters for different Se concentration profiles in CdTe

| Example | Efficiency (%) | Voc | Jsc | FF | Relative Amount of Se | Peak | Peak Location |
|---|---|---|---|---|---|---|---|
| Comparative Example 1 | 1.000 | 1.000 | 1.000 | 1.000 | 0.0 | 0.00 | none |
| Comparative Example 2 | 1.004 | 0.991 | 1.014 | 0.998 | 1.0 | 0.03 | front |
| Comparative Example 3 | 1.060 | 0.893 | 1.186 | 1.002 | 32.0 | 0.40 | none |
| Comparative Example 4 | 1.041 | 0.924 | 1.169 | 0.963 | 16.0 | 0.40 | front |
| Example 2 | 1.033 | 0.999 | 1.028 | 1.006 | 1.0 | 0.25 | front |
| Example 3 | 1.102 | 0.998 | 1.100 | 1.004 | 4.4 | 0.20 | front |
| Example 4 | 1.102 | 0.998 | 1.100 | 1.004 | 3.0 | 0.40 | front 0.4 microns |

The appended claims are intended to claim the invention as broadly as it has been conceived and the examples herein presented are illustrative of selected embodiments from a manifold of all possible embodiments. Accordingly, it is the Applicants' intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of:" Where necessary, ranges have been supplied; those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

The invention claimed is:

1. A photovoltaic device, comprising:
a layer stack; and
an absorber layer disposed on the layer stack, the absorber layer having a light incident side and a back side opposite the light incident side, wherein:
the absorber layer comprises cadmium, tellurium, and selenium;
an atomic concentration of selenium varies non-linearly across a thickness of the absorber layer;
an average atomic concentration of selenium in the absorber layer is from about 0.001 atomic percent to about 20 atomic percent,
the atomic concentration of selenium is greater at the light incident side of the absorber layer than the atomic concentration of selenium at the back side of the absorber layer,
the absorber layer comprises a first region and a second region, the first region disposed proximate to the layer stack relative to the second region,
the first region of the absorber layer has a thickness between 200 nanometers to 1500 nanometers,
the second region of the absorber layer has a thickness between 200 nanometers to 1500 nanometers, and
a ratio of an average atomic concentration of selenium in the first region of the absorber layer to an average atomic concentration of selenium in the second region of the absorber layer is greater than 10.

2. The photovoltaic device of claim 1, wherein the atomic concentration of selenium varies non-monotonically across the thickness of the absorber layer.

3. The photovoltaic device of claim 1, wherein the atomic concentration of selenium in the absorber layer has a profile selected from an exponential profile, a top-hat profile, a step-change profile, a saw-tooth profile, a square-wave profile, a power law profile, or combinations thereof.

4. The photovoltaic device of claim 1, wherein the first region has a band gap that is lower than a band gap of the second region.

5. The photovoltaic device of claim 1, wherein the absorber layer further comprises sulfur, oxygen, copper, chlorine, or combinations thereof.

6. The photovoltaic device of claim 1, wherein at least a portion of selenium is present in the absorber layer in the form of a ternary compound, a quaternary compound, or combinations thereof.

7. The photovoltaic device of claim 1, wherein the absorber layer comprises a plurality of layers, and wherein the concentration of selenium varies across the plurality of layers.

8. The photovoltaic device of claim 1, wherein the layer stack further comprises a buffer layer; and a window layer disposed between the buffer layer and the absorber layer.

9. The photovoltaic device of claim 8, wherein the window layer comprises cadmium sulfide, oxygenated cadmium sulfide, zinc sulfide, cadmium zinc sulfide, cadmium selenide, indium selenide, indium sulfide, or combinations thereof.

10. The photovoltaic device of claim 1, wherein the device is substantially free of a cadmium sulfide layer.

11. A method of making the photovoltaic device of claim 1, comprising:
providing the absorber layer on the layer stack.

12. The method of claim 11, wherein the atomic concentration of selenium varies non-monotonically across the thickness of the absorber layer.

13. The method of claim 11, wherein the step of providing the absorber layer comprises contacting a semiconductor material with a selenium source.

14. The method of claim 13, wherein the selenium source comprises elemental selenium, cadmium selenide, hydrogen selenide, organo-metallic selenium, or combinations thereof.

15. The method of claim 11, wherein the step of providing the absorber layer comprises:
(a) disposing a selenium source layer on the layer stack;
(b) disposing the absorber layer on the selenium source layer; and
(c) introducing selenium from the selenium source layer into at least a portion of the absorber layer.

16. The method of claim 15, wherein the selenium source layer has an average thickness in a range from about 1 nanometer to about 1000 nanometers.

17. The method of claim 11, wherein the step of providing the absorber layer comprises co-depositing a selenium source material and a semiconductor material.

18. The method of claim 17, wherein the selenium source material comprises elemental selenium, cadmium selenide, cadmium telluride selenide, or combinations thereof.

19. The photovoltaic device of claim 6, wherein the at least a portion of selenium is present in the absorber layer in the form of ternary compound, $CdSe_xTe_{(1-x)}$, wherein x is from about 0.01 to about 0.99, and wherein the value of x varies across the thickness of the absorber layer.

20. The photovoltaic device of claim 1, wherein the photovoltaic device is substantially free of a window layer heterojunction partner.

21. The photovoltaic device of claim 1, wherein the layer stack comprises an interlayer comprising a metal species selected from magnesium, gadolinium, aluminum, beryllium, calcium, barium, strontium, scandium, yttrium, hafnium, cerium, lutetium, lanthanum, and combinations thereof.

\* \* \* \* \*

UNITED STATES PATENT AND TRADEMARK OFFICE
CERTIFICATE OF CORRECTION

PATENT NO. : 10,062,800 B2
APPLICATION NO. : 13/912782
DATED : August 28, 2018
INVENTOR(S) : Holly Ann Blaydes et al.

It is certified that error appears in the above-identified patent and that said Letters Patent is hereby corrected as shown below:

In the Specification

Column 16, Line 30, Please change the equation from:
"$E_{g,alloy} = x\, E_{g,CdSe} + (1-x)\, E_{g,CdTe} + bx(1-x)$"
To:
-- $E_{g,alloy} = x\, E_{g,CdSe} + (1-x)\, E_{g,CdTe} - bx(1-x)$ --.

Signed and Sealed this
Twenty-third Day of October, 2018

Andrei Iancu
*Director of the United States Patent and Trademark Office*